United States Patent
Nagamori

(10) Patent No.: US 11,619,555 B2
(45) Date of Patent: Apr. 4, 2023

(54) PRESSURE DETECTION SENSOR AND ELECTRONIC DEVICE

(71) Applicant: Murata Manufacturing Co., Ltd., Nagaokakyo (JP)

(72) Inventor: Shiori Nagamori, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 738 days.

(21) Appl. No.: 16/593,015

(22) Filed: Oct. 4, 2019

(65) Prior Publication Data
US 2020/0041364 A1 Feb. 6, 2020

Related U.S. Application Data

(63) Continuation of application No. PCT/JP2018/038276, filed on Oct. 15, 2018.

(30) Foreign Application Priority Data

Oct. 20, 2017 (JP) .............................. JP2017-203834

(51) Int. Cl.
*G01L 1/16* (2006.01)
*H01L 41/04* (2006.01)
(Continued)

(52) U.S. Cl.
CPC .............. *G01L 1/16* (2013.01); *H01L 41/042* (2013.01); *H01L 41/047* (2013.01);
(Continued)

(58) Field of Classification Search
CPC ... G01L 1/16; G01L 9/008; G01L 9/08; H01L 41/042; H01L 41/047; H01L 41/053; H01L 41/1132; H01L 41/1138; H01L 41/193
(Continued)

(56) References Cited

U.S. PATENT DOCUMENTS 4,594,526 A * 6/1986 Araki .................... H01L 41/042
310/317
5,571,972 A 11/1996 Okada
(Continued)

FOREIGN PATENT DOCUMENTS

EP 2982938 A1 * 2/2016 ............... G01B 7/16
JP S55116244 U 8/1980
(Continued)

OTHER PUBLICATIONS

International Search Report issued in PCT/JP2018/038276, dated Dec. 11, 2018.
(Continued)

*Primary Examiner* — Nathaniel T Woodward
(74) *Attorney, Agent, or Firm* — ArentFox Schiff LLP

(57) ABSTRACT

A pressure detection sensor having a piezoelectric film with a first region and a second region located outside the first region, the piezoelectric film being deformable by a pressing operation, a first electrode pair disposed on a first main surface and a second main surface in the first region of the piezoelectric film, and a second electrode pair formed on a first main surface and a second main surface in the second region of the piezoelectric film. When the piezoelectric film receives a pressing operation, the first electrode pair outputs a voltage having a polarity different from that of the second electrode pair.

20 Claims, 8 Drawing Sheets

(51) Int. Cl.
*H01L 41/047* (2006.01)
*H01L 41/053* (2006.01)
*H01L 41/113* (2006.01)
*H01L 41/193* (2006.01)

(52) U.S. Cl.
CPC ........ *H01L 41/053* (2013.01); *H01L 41/1132* (2013.01); *H01L 41/1138* (2013.01); *H01L 41/193* (2013.01)

(58) Field of Classification Search
USPC .................................................... 73/862.625
See application file for complete search history.

(56) References Cited

U.S. PATENT DOCUMENTS

| | | | |
|---|---|---|---|
| 9,627,605 B2 | 4/2017 | Ando et al. | |
| 10,248,232 B2 | 4/2019 | Ando et al. | |
| 2014/0049137 A1* | 2/2014 | Ando | G01D 5/185 310/330 |
| 2015/0153880 A1 | 6/2015 | Ando | |
| 2015/0242037 A1 | 8/2015 | Pedder et al. | |
| 2015/0346881 A1 | 12/2015 | Watazu | |
| 2017/0131806 A1 | 5/2017 | Ando et al. | |

FOREIGN PATENT DOCUMENTS

| | | | | |
|---|---|---|---|---|
| JP | H0743226 A | 2/1995 | | |
| WO | 2010143528 A1 | 12/2010 | | |
| WO | WO-2012002942 A1 * | 1/2012 | .......... | B41J 2/14282 |
| WO | 2012137897 A1 | 10/2012 | | |
| WO | 2014109257 A1 | 7/2014 | | |
| WO | 2016002459 A1 | 1/2016 | | |
| WO | 2016027818 A1 | 2/2016 | | |
| WO | WO-2016027818 A1 * | 2/2016 | ............ | G06F 3/041 |

OTHER PUBLICATIONS

Written Opinion of the International Searching Authority issued in PCT/JP2018/038276, dated Dec. 11, 2018.

* cited by examiner

PRESSURE DETECTION SENSOR AND ELECTRONIC DEVICE

CROSS REFERENCE TO RELATED APPLICATIONS

The present application is a continuation of PCT/JP2018/038276 filed Oct. 15, 2018, which claims priority to Japanese Patent Application No. 2017-203834, filed Oct. 20, 2017, the entire contents of each of which are incorporated herein by reference.

TECHNICAL FIELD

The present invention generally relates to a pressure detection sensor that detects a position at which a user performs a pressing operation, and an electronic device including the same.

BACKGROUND

Patent Document 1 (identified below) discloses a touch panel including an operation input member, a pressing force detection sensor, and an adhesive layer. In the touch panel described in Patent Document 1, the operation input member is distorted due to pressure on the operation surface, and the pressing force detection sensor detects the piezoelectric voltage according to the amount of distortion of the piezoelectric film. Further, the adhesive layer bonds the operation input member and the pressing force detection sensor.

Patent Document 1: International Publication No. 2016/002459.

In the touch panel described in Patent Document 1, the piezoelectric voltage is detected when deformation occurs due to pressure on the operation surface. However, when noise from the outside is generated, for example, when a portion other than the operation surface receives a pressing operation, voltage may be generated and erroneously detected by a cause other than the pressing operation on the operation surface.

SUMMARY OF THE INVENTION

Therefore, the present invention provides a pressure detection sensor and an electronic device including the same that is configured to distinguish, with a simple structure, between the case where noise from the outside is generated and the case where the operation surface receives a pressing operation, and further configured to correctly detect the case where the operation surface receives a pressing operation.

Thus, a pressure detection sensor according to one exemplary embodiment includes a piezoelectric film having a first region and a second region located outside the first region, the piezoelectric film being deformable by a pressing operation from a user, a first electrode pair formed on a first main surface and a second main surface in the first region of the piezoelectric film, and a second electrode pair formed on a first main surface and a second main surface in the second region of the piezoelectric film. Moreover, the pressure detection sensor has a feature that when the piezoelectric film receives a pressing operation, the first electrode pair outputs a voltage having a polarity different from that of the second electrode pair.

In this configuration, when the piezoelectric film receives a pressing operation, the first electrode pair formed in the first region and the second electrode pair formed in the second region output voltages of different polarities. Therefore, according to the output difference of the voltages output from the first electrode pair and the second electrode pair, the sensor can determine whether it is the case where the piezoelectric film receives a pressing operation or it is simply noise from the periphery of the piezoelectric film.

Moreover, an electronic device according to an exemplary embodiment of the present invention includes the pressure detection sensor described above.

In this configuration, when the piezoelectric film receives a pressing operation, the first electrode pair formed in the first region and the second electrode pair formed in the second region output voltages of different polarities. Therefore, according to the output difference of the voltages output from the first electrode pair and the second electrode pair, the electronic device can determine whether it is the case where the piezoelectric film receives a pressing operation or it is simply noise from the periphery of the piezoelectric film.

According to an exemplary embodiment of the present invention, it is possible to distinguish, with a simple structure, between the case where noise from the outside is generated and the case where the operation surface receives a pressing operation, and to correctly detect the case where the operation surface receives a pressing operation.

DETAILED DESCRIPTION

Figure 1A:
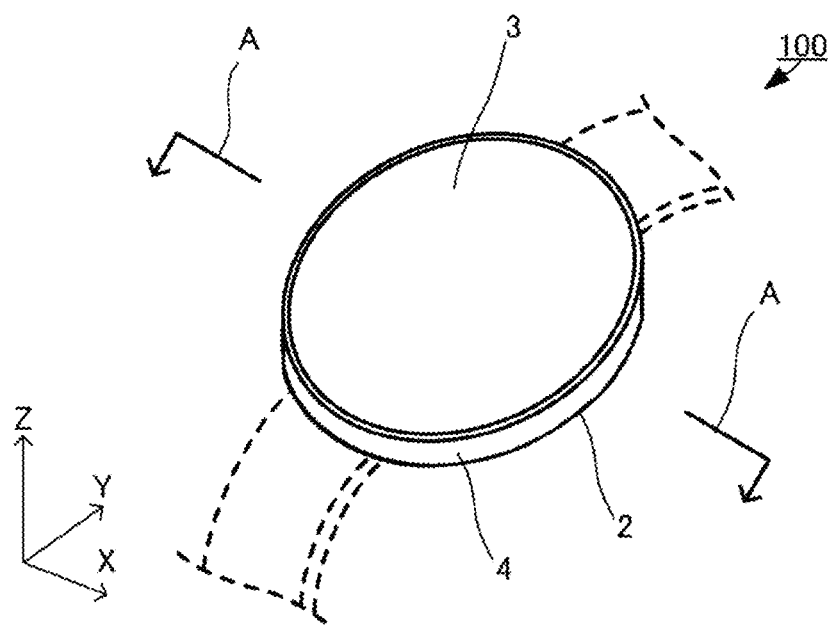
FIG. 1(A) is a perspective view of an electronic device using a pressure detection sensor according to a first embodiment.
Figure 1B:
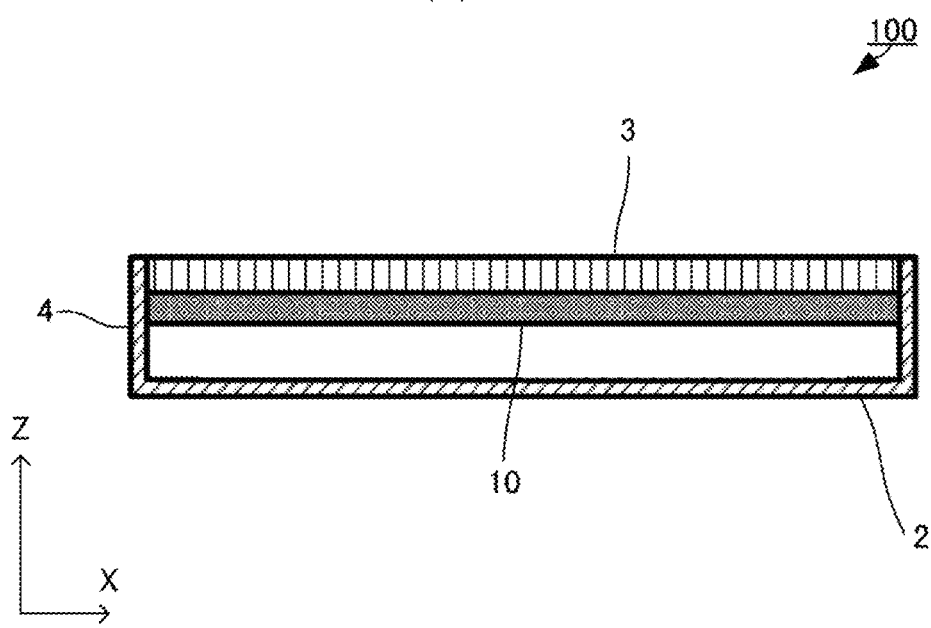
FIG. 1(B) is a cross-sectional view thereof.

FIG. 1(A) is a perspective view of an electronic device using a pressure detection sensor according to a first embodiment, and FIG. 1(B) is a cross-sectional view taken along line A-A of FIG. 1(A). For purposes of this disclosure, as shown in FIGS. 1(A) and 1(B), description will be given based on the premise that the width direction (i.e., a lateral direction) of a housing 2 is taken as an X direction, the length direction (i.e., longitudinal direction) as a Y direction, and the thickness direction as a Z direction (i.e., thickness or vertical direction). It is noted that the electronic device illustrated in FIGS. 1(A) and 1(B) is merely an example embodiment, and the exemplary embodiment is not limited to this configuration and can be appropriately modified in accordance with the specification. Moreover, it is noted that in FIG. 1(B), a part of the pressure detection sensor is omitted for convenience of explanation.

As shown in FIGS. 1(A) and 1(B), an electronic device 100 includes the housing 2 and a pressure detection sensor 10. The housing 2 has a substantially disk shape and is open in the positive direction of the Z direction. The housing 2 has a flat front panel 3, and the front panel 3 forms the upper surface of the housing 2. The front panel 3 is configured to function as an operation surface on which a user performs a touch operation using a finger or a pen. It is noted that the housing 2 is not limited to a substantially disc shape, and may have any other three-dimensional shape, such as a hemispherical shape, a cubic shape, or a triangular prism.

The housing 2 has a side surface part 4. One end of the side surface part 4 surrounds a front panel 3. The pressure detection sensor 10 is disposed inside the housing 2. Hereinafter, the pressure detection sensor 10 will be described in detail.

Figure 2A:
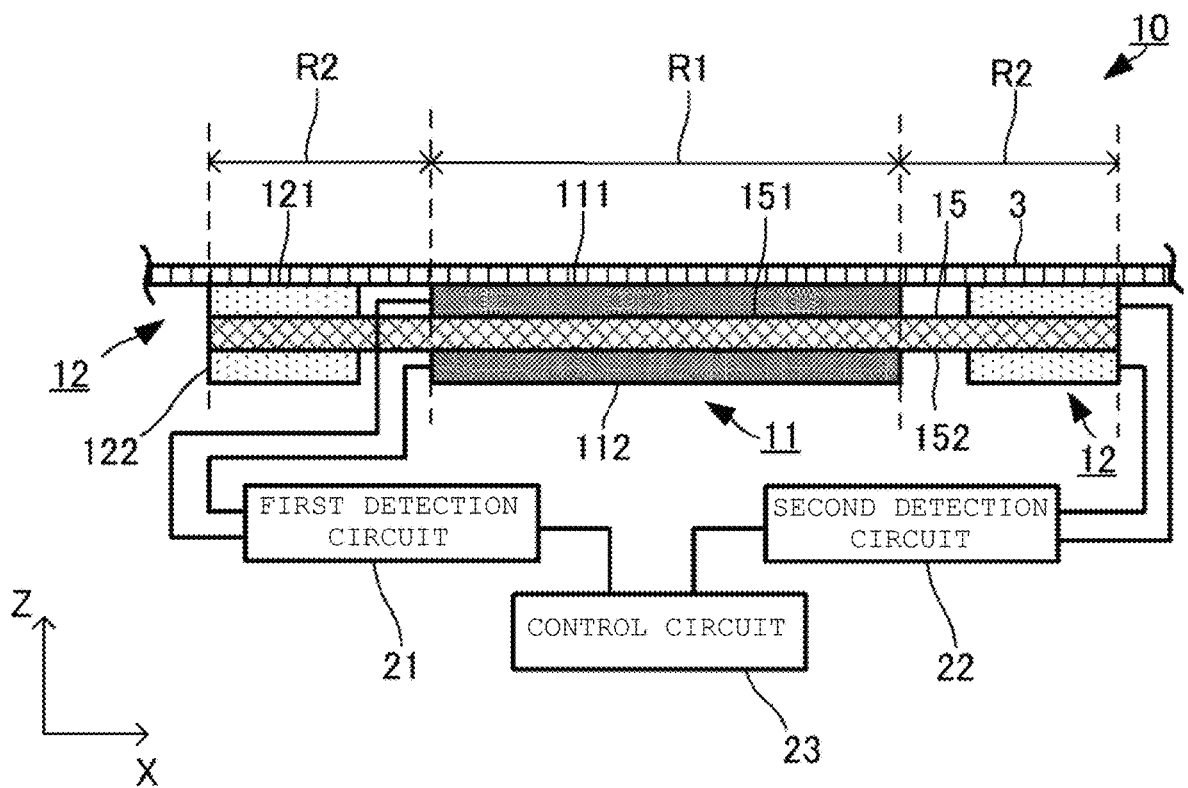
FIG. 2(A) is a schematic view for describing the configuration of the pressure detection sensor according to the first embodiment.
Figure 2B:
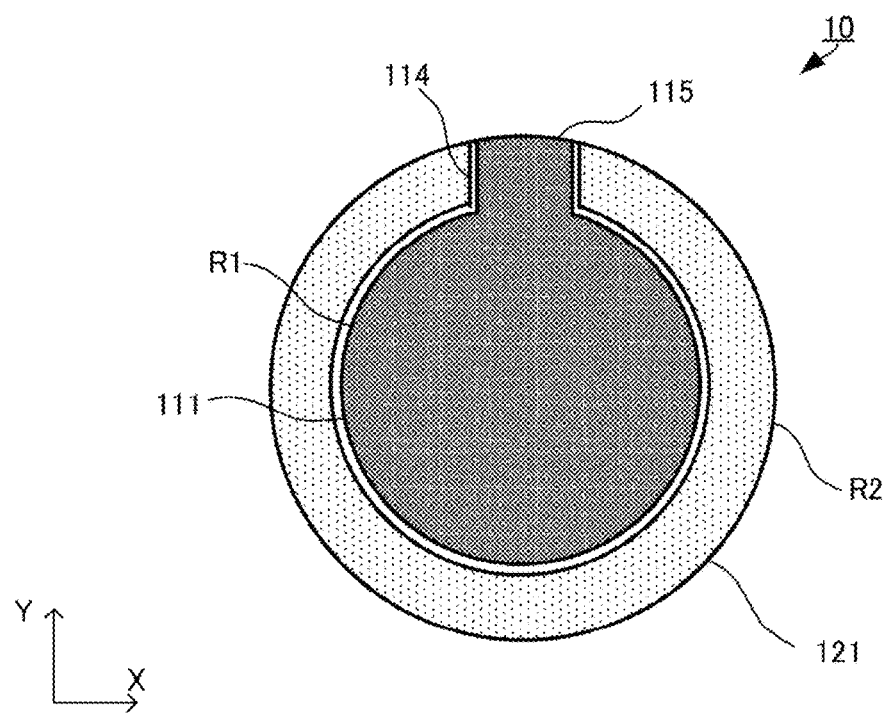
FIG. 2(B) is a plan view of the pressure detection sensor according to the first embodiment.
Figure 3:
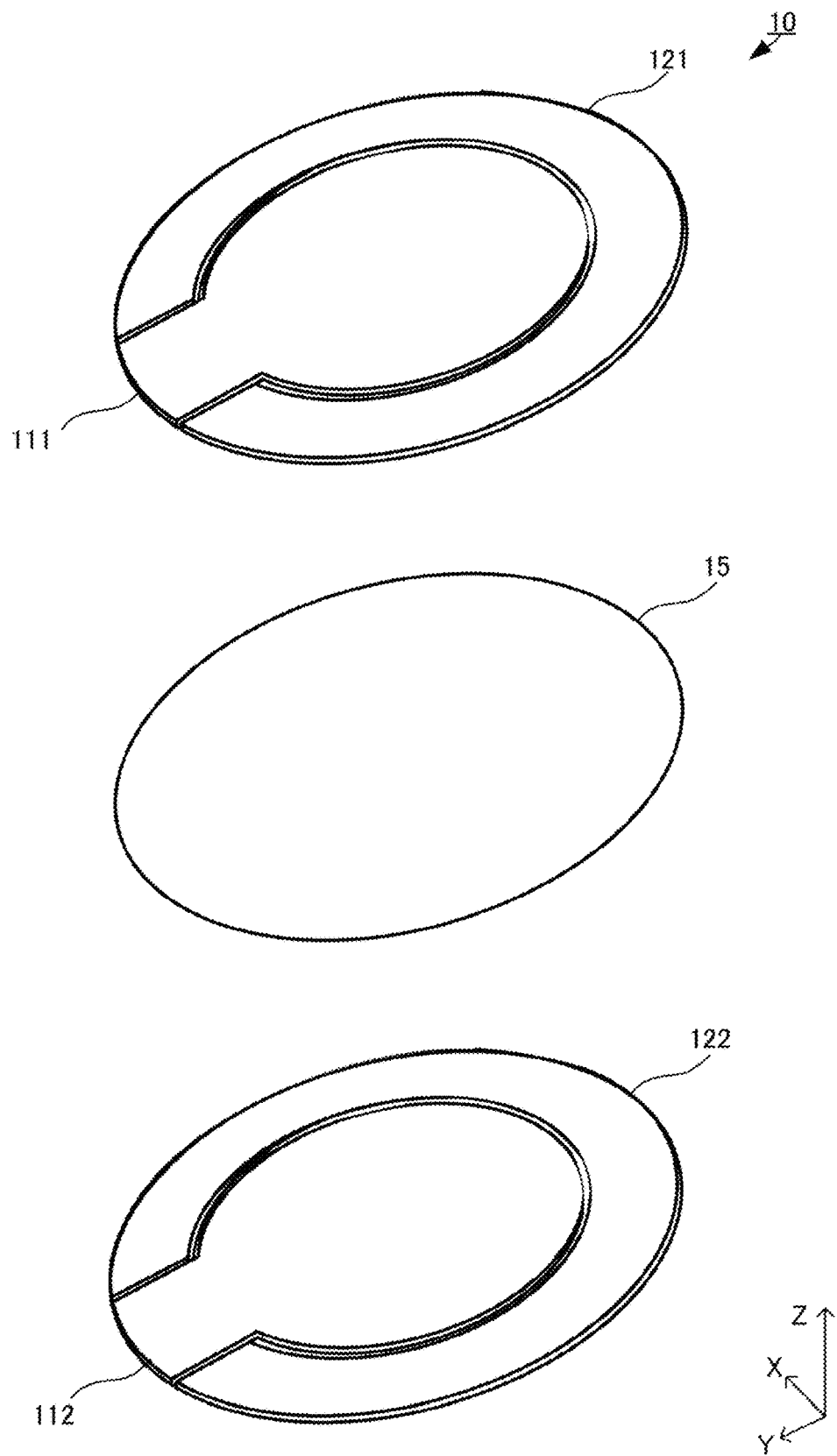
FIG. 3 is an exploded perspective view of the pressure detection sensor according to the first embodiment.

FIG. 2(A) is a schematic view for describing the configuration of the pressure detection sensor according to the first embodiment, and FIG. 2(B) is a plan view of the pressure detection sensor according to the first embodiment. FIG. 3 is an exploded perspective view of the pressure detection sensor according to the first embodiment. It is noted that in FIG. 2(A), the front panel 3 is also collectively represented for convenience of description of a position.

As shown in FIG. 2(A), the pressure detection sensor 10 includes a piezoelectric film 15, a first electrode pair 11, a second electrode pair 12, a first detection circuit 21, a second detection circuit 22, and a control circuit 23.

The piezoelectric film 15 is deformed by a pressing operation from a user. The piezoelectric film 15 includes a first main surface 151 and a second main surface 152. In the first embodiment, the first main surface 151 is a surface facing the front panel 3.

As shown in FIG. 2(B), the pressure detection sensor 10 has a first region R1 and a second region R2 located outside the first region R1. The first electrode pair 11 is formed/disposed in a part corresponding to the first region R1. The second electrode pair 12 is formed/disposed in a part corresponding to the second region R2. The first region R1 has the same surface area as the second region R2. Thereby, the area of the first electrode pair 11 and the area of the second electrode pair 12, in contact with the first main surface 151 and the second main surface 152, are substantially the same according to the exemplary aspect.

Although the position of the pressure detection sensor 10 is disposed inside the housing 2, the position is not limited thereto, and may be disposed outside the housing 2. The pressure detection sensor 10 is disposed on the inside of the housing 2 and thus does not receive external contact directly, so that the durability is excellent. Further, when the pressure detection sensor 10 is disposed on the outside of the housing 2, the pressure detection sensor 10 can be easily made removable as needed.

The first electrode pair 11 includes a first electrode 111 and a first reference electrode 112. The first electrode 111 is formed/disposed on the first main surface 151 of the piezoelectric film 15, and the first reference electrode 112 is formed/disposed on the second main surface 152 of the piezoelectric film 15. The second electrode pair 12 includes a second electrode 121 and a second reference electrode 122. The second electrode 121 is formed/disposed on the first main surface 151 of the piezoelectric film 15, and the second reference electrode 122 is formed/disposed on the second main surface 152 of the piezoelectric film 15.

The first electrode 111 includes a protrusion 114. One end 115 of the protrusion 114 protrudes to the outer peripheral side of the second electrode 121 and thus the one end 115 of the protrusion 114 is connectable to the outside. Since the first electrode 111 can be connected to the outside on the same plane as the second electrode 121 by the protrusion 114, it is not necessary to provide another layer for insulating the second electrode 121 and to perform wiring. On the other hand, the protrusion 114 is not necessarily required, and the second electrode 121 may be formed so as to completely cover the periphery of the first electrode 111. As a result, the process of aligning the protrusion 114 can be omitted, whereby the manufacturing is simplified according to a variation of the exemplary embodiment.

Moreover, the first detection circuit 21 is connected to the first electrode 111 and the first reference electrode 112, respectively. Thereby, the first detection circuit 21 can detect the voltage generated between the first electrode 111 and the first reference electrode 112. That is, the first detection circuit 21 can detect the voltage generated in the first region R1. The second detection circuit 22 is connected to the second electrode 121 and the second reference electrode 122, respectively. Thereby, the second detection circuit 22 can detect the voltage generated between the second electrode 121 and the second reference electrode 122. That is, the second detection circuit 22 can detect the voltage generated in the second region R2.

The first detection circuit 21 and the second detection circuit 22 are both connected to the control circuit 23. The voltages detected by the first detection circuit 21 and the second detection circuit 22 are input to the control circuit 23. In the control circuit 23, a difference between the voltages detected by the first detection circuit 21 and the second detection circuit 22 is calculated. The calculation of the voltage difference will be described in detail later.

As shown in FIG. 3, the piezoelectric film 15 is formed in a circular shape. When the center of the piezoelectric film 15 receives a pressing operation, the piezoelectric film 15 is uniformly distorted in the circumferential direction from the center. Thereby, voltage fluctuation generated from the piezoelectric film 15 in the circumferential direction is suppressed. Thus, the piezoelectric film 15 is preferably formed in line symmetry or point symmetry. By forming the piezoelectric film 15 in line symmetry or point symmetry, the voltage fluctuation generated from the piezoelectric film 15 in the circumferential direction can easily be suppressed.

The first electrode 111, the piezoelectric film 15, and the first reference electrode 112 are stacked in a state where the piezoelectric film 15 is interposed. Likewise, the second electrode 121, the piezoelectric film 15, and the second reference electrode 122 are stacked in a state where the piezoelectric film 15 is interposed. Moreover, it is preferable that each of the first electrode 111, the first reference electrode 112, the second electrode 121, the second reference electrode 122, and the piezoelectric film 15 is in a flat film shape. Thus, the pressure detection sensor 10 is easily deformed as a whole in response to the pressing operation.

In a plan view of the second electrode pair 12, at least one of the second electrode 121 and the second reference electrode 122 may completely overlap the piezoelectric film 15 in top view, or may be positioned inside in the surface direction from the piezoelectric film 15. Thereby, a short circuit at the end of the electrode can be suppressed. In FIG. 2(A) and FIG. 3, the first reference electrode 112 and the second reference electrode 122 are provided as separate electrodes, but may be provided as one continuous electrode.

Figure 4:
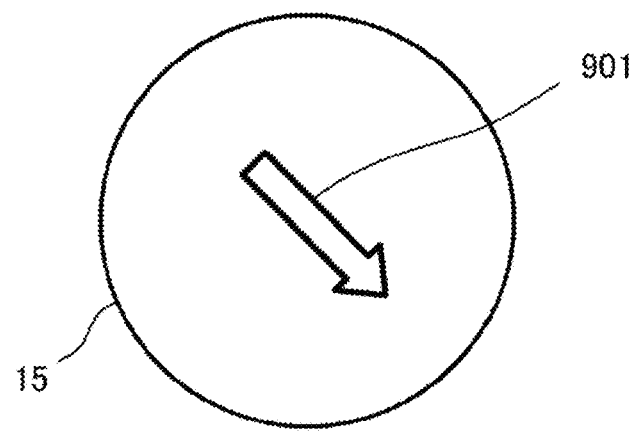
FIG. 4 is a diagram for describing a piezoelectric film according to the first embodiment.
Figure 4:
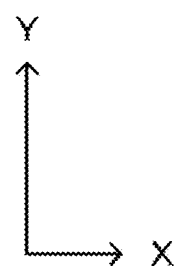

FIG. 4 is a diagram for describing the piezoelectric film according to the first embodiment.

As shown in FIG. 4, the piezoelectric film 15 may be a film formed of a chiral polymer. In the first embodiment, polylactic acid (PLA), particularly L-type polylactic acid (PLLA) is used as the chiral polymer. PLLA made of a chiral polymer has a helical structure in the main chain. PLLA has piezoelectricity when it is uniaxially stretched and molecules are oriented. The uniaxially stretched PLLA generates a potential when the flat surface of the piezoelectric film 15 is pressed. At this time, the amount of potential generated depends on the amount of displacement in which the flat surface is displaced in a direction perpendicular to the flat surface by the pressing amount.

In the first embodiment, the uniaxial stretching direction of the piezoelectric film 15 (PLLA) is a direction forming an angle of 45 degrees in the opposite direction with respect to the X direction and the Y direction as shown by arrow 901 in FIG. 4. The 45 degrees include an angle of 45 degrees±10 degrees, for example.

In PLLA, piezoelectricity is generated by orientation processing of molecules through stretching or the like, and it is not necessary to perform poling treatment like other polymers such as PVDF and piezoelectric ceramics. That is, the piezoelectricity of PLLA which does not belong to ferroelectrics is not expressed by polarization of ions as in the case of a ferroelectric such as PVDF or PZT but is derived from a helical structure that is a characteristic structure of a molecule. For this reason, PLLA does not have pyroelectricity that occurs in other ferroelectric piezoelectric materials. Advantageously, the piezoelectric film 15 can be formed thin because it does not have pyroelectricity and is not affected by the temperature or frictional heat of the user's finger. Furthermore, although PVDF and the like show variations in the piezoelectric constant over time, and in some cases the piezoelectric constant may significantly decrease, the piezoelectric constant of PLLA is extremely stable over time. Therefore, displacement due to pressure can be detected with high sensitivity without being affected by the surrounding environment.

When a film formed of a chiral polymer is used as the piezoelectric film 15, the protrusion 114 is preferably formed along a direction forming an angle of −45 degrees with respect to the stretching direction of the chiral polymer. The protrusion 114 corresponds to a portion where a large positive voltage is generated from the piezoelectric film 15 when the pressing operation is applied to the piezoelectric film 15. With arrangement of the protrusion 114 at this position, the positive voltage detected by the first electrode pair 11 becomes larger. Since the difference between the output obtained on the first electrode pair 11 side and the output obtained on the second electrode pair 12 side can be increased, pressure can be detected more accurately.

In the present embodiment, the protrusion 114 of the first electrode 111 and the protrusion 114 of the first reference electrode 112 are formed at substantially overlapping positions in a plan view, but one of the protrusions may be formed on the negative side of the Y axis with reference to the X axis in FIG. 3. However, a larger positive voltage can be obtained when the protrusion 114 of the first electrode 111 and the protrusion 114 of the first reference electrode 112 are formed so as to substantially overlap in a plan view.

As the first electrode 111, the first reference electrode 112, the second electrode 121, or the second reference electrode 122 formed on either main surface of the piezoelectric film 15, it is preferable to use a metal-based electrode such as aluminum or copper. When the pressure detection sensor 10 needs to have transparency, it is preferable to use a transparent material such as indium tin oxide (ITO) or poly (3,4-ethylenedioxythiophene) (PEDOT) for the first electrode 111, the first reference electrode 112, the second electrode 121, or the second reference electrode 122. By providing such a first electrode 111, a first reference electrode 112, a second electrode 121, and a second reference electrode 122, the charge generated by the piezoelectric film 15 can be acquired as a potential difference, and a pressure amount can be outputted, that is, a pressure amount detection signal of a voltage value corresponding to the deformation, to the outside.

In addition, while the piezoelectric film 15 is used in the pressure detection sensor 10, the piezoelectric film 15 may be configured for each of the first region R1 or second region R2. Thereby, since the deformation received in the first region R1 or the second region R2 is received for each of the piezoelectric films, the generated potential can be detected by each of the first region R1 or the second region R2.

Figure 5:
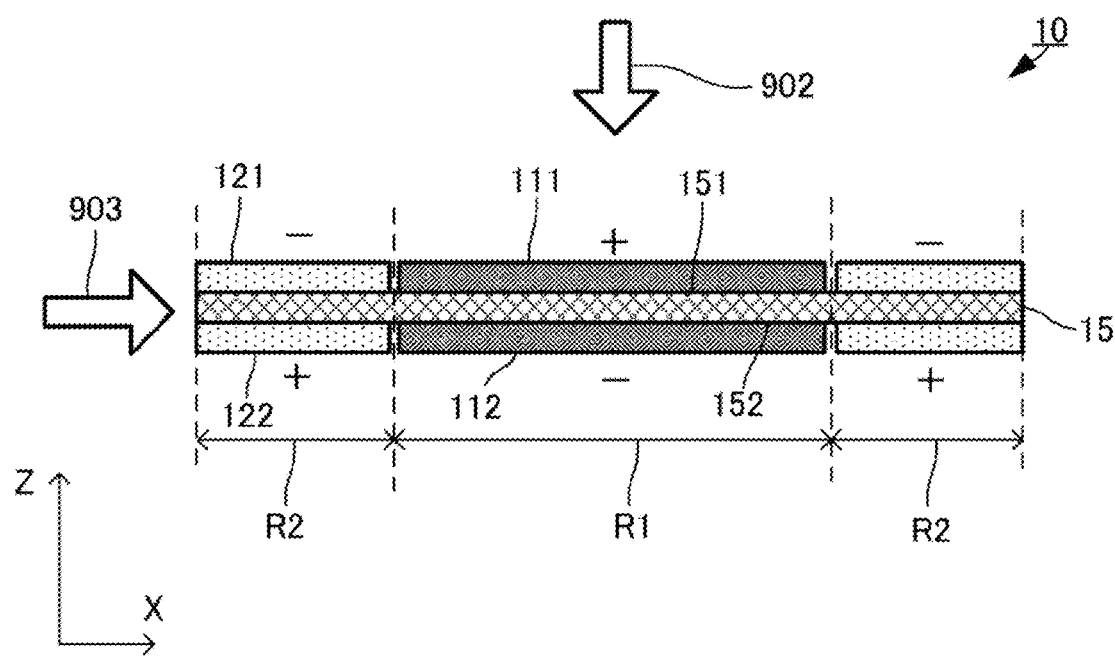
FIG. 5 is a diagram for describing deformation of the pressure detection sensor and generated potential according to the first embodiment.

Hereinafter, deformation and generated potential of the pressure detection sensor 10 according to the present embodiment will be described. First, the case where the front panel 3 in the pressure detection sensor 10 is pressed will be described. FIG. 5 is a diagram for describing the deformation and the generated potential of the pressure detection sensor according to the first embodiment.

As shown in FIG. 5, when the front panel 3 receives a pressing operation, the pressure detection sensor 10 receives the pressing operation from a direction of arrow 902. When the front panel 3 receives the pressing operation, the piezoelectric film 15 is deformed along with deformation of the front panel 3. At this time, the first electrode pair 11 outputs a voltage having a polarity different from that of the second electrode pair 12. For example, the first electrode pair 11 outputs a positive voltage, and the second electrode pair 12 outputs a negative voltage.

In particular, when the center of the piezoelectric film 15 receives a pressing operation, the piezoelectric film 15 is distorted in the negative direction of the Z direction in the first region R1. At this time, the first main surface 151 side of the piezoelectric film 15 shrinks in the Y direction. The second main surface 152 side of the piezoelectric film 15 extends in the Y direction. Therefore, as shown in FIG. 5, in the first region R1, positive charges are generated on the first main surface 151 side and negative charges are generated on the second main surface 152 side in the piezoelectric film 15.

On the other hand, when the center of the piezoelectric film 15 receives the pressing operation, in the second region R2, the piezoelectric film 15 receives a repulsive force in the direction of distortion in the positive direction of the Z direction. At this time, the first main surface 151 side of the piezoelectric film 15 extends in the Y direction. The second main surface 152 side of the piezoelectric film 15 shrinks in the Y direction. Therefore, as shown in FIG. 5, in the second region R2, in the piezoelectric film 15, negative charges are generated on the first main surface 151 side and positive charges are generated on the second main surface 152 side.

The first detection circuit 21 can be a conventional voltage detector configured to detect a positive voltage from the first electrode pair 11. Likewise, the second detection circuit 22 can be a conventional voltage detector configured to detect a negative voltage from the second electrode pair 12. The control circuit 23 (e.g., a voltage comparator) is provided and configured to calculate a difference between the voltages detected by the first detection circuit 21 and the second detection circuit 22. As a result, a value obtained by adding the absolute value of the voltage detected by the second detection circuit 22 to the positive voltage detected by the first detection circuit 21 is calculated. Therefore, since the first electrode pair 11 and the second electrode pair 12 output voltages of opposite polarities, it is possible to more clearly detect that the front panel 3 has received a pressing operation.

Next, the case where a portion other than the front panel 3 receives a pressing operation, that is, the case where the pressure detection sensor 10 receives a pressing operation from a direction of arrow 903, for example, will be described. When the piezoelectric film 15 receives a pressing operation from the direction of arrow 903, the piezoelectric film 15 deforms in the same direction in the first region R1 and in the second region R2. Therefore, the first electrode pair 11 and the second electrode pair 12 output voltages of the same polarity. Therefore, when the difference between the voltages detected by the first detection circuit 21 and the second detection circuit 22 is calculated, the obtained value is smaller because they have the same polarity. Therefore, the case where the front panel 3 receives the pressing operation and the case where it is not so can be determined by the difference between the voltages detected by the first detection circuit 21 and the second detection circuit 22.

In the present embodiment, a uniaxially stretched chiral polymer is used as the piezoelectric film 15. However, the exemplary embodiment of the present invention is not limited thereto. It is possible to use another configuration instead of it if the first electrode pair 11 and the second electrode pair 12 output voltages of opposite polarities when the front panel 3 receives a pressing operation. For example, when an output of the same polarity is obtained regardless of the direction of deformation, the polarity of either one of the obtained voltages of the first electrode pair 11 and the second electrode pair 12 is inverted. Thereby, since the voltages detected by the first detection circuit 21 and the second detection circuit 22 can be made to have opposite polarities, a similar effect can be obtained.

Figure 6A:
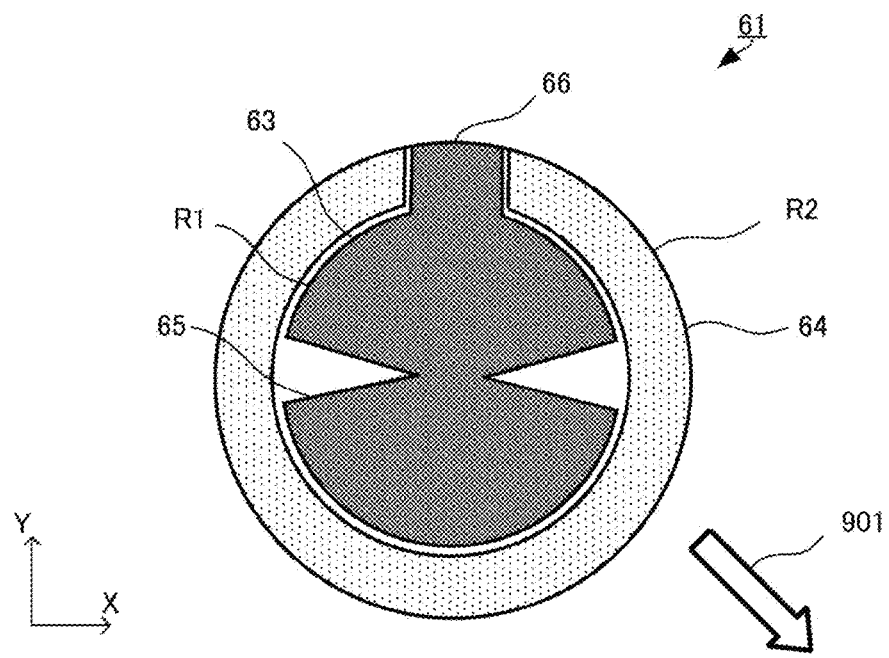
FIG. 6(A) is a diagram for describing a first refinement of the pressure detection sensor according to the first embodiment.
Figure 6B:
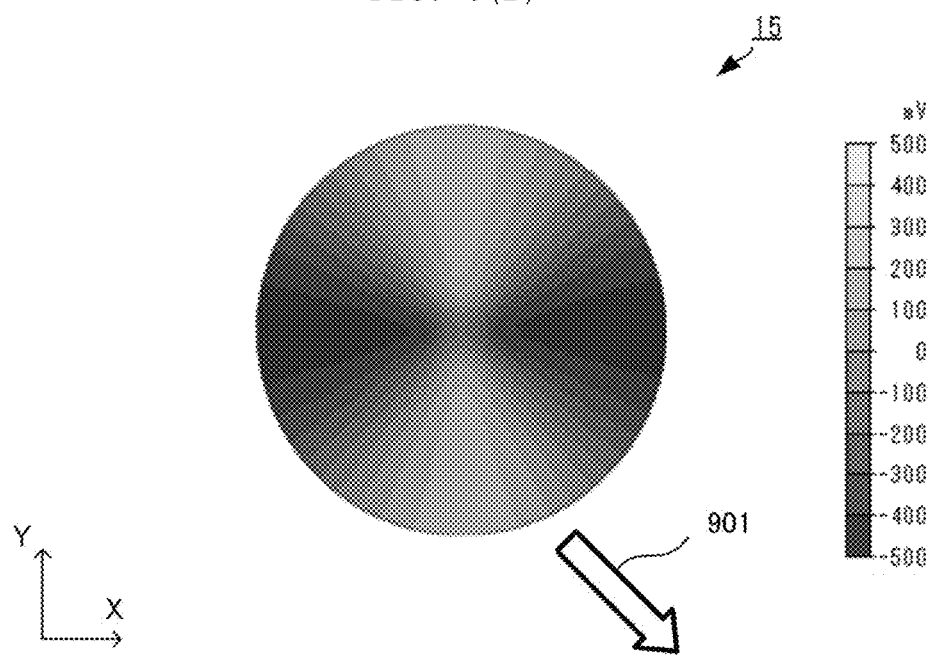
FIG. 6(B) is a diagram showing surface potential generated by the piezoelectric film according to the first embodiment.

FIG. 6(A) is a diagram for describing a first refinement of the pressure detection sensor according to the first embodiment, and FIG. 6(B) is a diagram showing surface potential generated by the piezoelectric film according to the first embodiment. FIG. 6(B) shows surface potential generated when the center of the piezoelectric film 15, formed in a circle having a diameter of 4 mm, receives a pressing operation with a force of 1 N. Hereinafter, this embodiment having different first electrode pair 11 in the pressure detection sensor 10 will be described. It is noted that in the alternative embodiment of the pressure detection sensor 10, description on the structure that is the same as that of the pressure detection sensor 10 is omitted, and description is provided only on an electrode pair.

As shown in FIG. 6(A), a pressure detection sensor 61 according to the exemplary embodiment includes a first electrode pair 63 and a second electrode pair 64. Since the second electrode pair 64 is the same as the second electrode pair 12 of the pressure detection sensor 10, the description thereof is omitted.

The first electrode pair 63 includes a cutout portion 65 in the X-axis direction. The cutout portion 65 is a part that is cut away from the periphery of the first electrode pair 63 toward the center. The first electrode pair 63 does not exist in the cutout portion 65. Thus, the voltage generated from the piezoelectric film 15 in the portion corresponding to the cutout portion 65 is not detected by the first electrode pair 63.

As shown in FIG. 6(B), when the center of the piezoelectric film 15 receives a pressing operation, negative potential is generated in the direction along the X axis from the center, and positive potential is generated in the direction along the Y axis from the center. That is, a voltage having a large absolute value occurs in a negative or positive direction along a direction forming an angle of 45 degrees clockwise or counterclockwise with respect to the uniaxial stretching direction (i.e., arrow 901) of PLLA.

The cutout portion 65 of the first electrode pair 63 overlaps the region where the potential on the negative side is generated in the piezoelectric film 15. The negative potential generated from the piezoelectric film 15 is not detected by the first electrode pair 63. As a result, the negative potential can be removed, so that it is possible to suppress a decrease in the voltage detected as a whole of the first electrode pair 63 by canceling the positive potential generated by the piezoelectric film 15. Therefore, since a larger positive voltage can be obtained, detection can be made more clearly than the time when the pressing operation is received.

Further, the protrusion 66 of the first electrode pair 63 is formed in the direction along the Y axis. The protrusion 66 is formed along a direction forming an angle of 45 degrees clockwise with respect to the uniaxial stretching direction (arrow 901) of PLLA. That is, the protrusion 66 is formed in a direction opposite to the cutout portion 65, along a direction forming an angle of 45 degrees with respect to the uniaxial stretching direction (arrow 901) of the PLLA. The protrusion 66 corresponds to a portion where a large positive voltage is generated from the piezoelectric film 15. Therefore, the positive voltage detected by the first electrode pair 63 is larger.

In this exemplary embodiment, the simulation result of the voltage difference generated from the first electrode pair 63 and the second electrode pair 64 is eight times the voltage difference generated from the first electrode pair 11 and the second electrode pair 12 according to the first embodiment. Therefore, since a larger positive voltage can be obtained, detection can be made more clearly than the time when the pressing operation is received.

Although the protrusion 66 is formed in a direction forming an angle of 90 degrees with respect to the direction in which the cutout portion 65 is formed, it is not limited thereto. For example, the protrusion 66 may be formed in a direction forming an angle of 45 degrees clockwise or 45 degrees counterclockwise (−45 degrees clockwise) with respect to the direction in which the cutout portion 65 is formed. In this case, the portion where the protrusion 66 is formed is formed in a direction along an axis parallel or orthogonal to the uniaxial stretching direction (arrow 901) of the piezoelectric film 15. Therefore, since it is a portion where voltage is hardly generated from the piezoelectric film 15, it can be connected to the outside without being affected by the voltage generated from the piezoelectric film 15.

Figure 7:
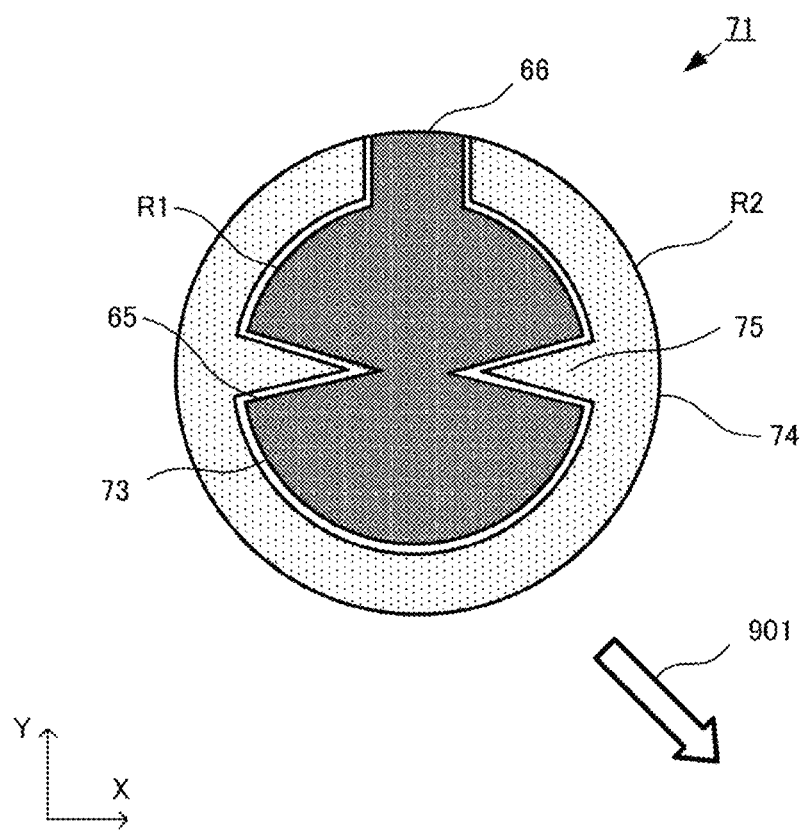
FIG. 7 is a diagram for describing a second refinement of the pressure detection sensor according to the first embodiment.

FIG. 7 is a diagram for describing a second refinement of the pressure detection sensor according to the first embodiment. Hereinafter, this embodiment having different first electrode pair 11 and second electrode pair 12 in the pressure detection sensor 10 will be described. In the description of this exemplary embodiment, the description of the same configuration as that of the first refinement of the exemplary embodiment is omitted.

As shown in FIG. 7, a pressure detection sensor 71 according to the exemplary embodiment includes a first electrode pair 73 and a second electrode pair 74. The first electrode pair 73 is similar to the first electrode pair 63 of the pressure detection sensor 61 according to the first refinement of the exemplary embodiment, and thus the description thereof is omitted.

The second electrode pair 74 includes a protruding portion 75 in the X-axis direction. The protruding portion 75 is formed at a position corresponding to the cutout portion 65. That is, the protruding portion 75 is a part protruding from the inner periphery of the second electrode pair 74 toward the center. The second electrode pair 74 exists in the cutout portion 65. Thus, the voltage generated from the piezoelectric film 15 in the portion corresponding to the cutout portion 65 is detected by the second electrode pair 74.

As shown in FIG. 6(B), when the center of the piezoelectric film 15 receives a pressing operation, a negative voltage is generated in the direction along the X axis. That is, in the direction along the X axis at an angle of 45 degrees counterclockwise with respect to the uniaxial stretching direction (arrow 901) of PLLA, a negative voltage having a large absolute value is generated.

The protruding portion 75 of the second electrode pair 74 overlaps the area of the piezoelectric film 15, the area being an area where the negative voltage is generated. The negative voltage generated from the piezoelectric film 15 is detected by the second electrode pair 74. The second electrode pair 74 can detect a larger voltage in the negative direction. As a result, the difference between the positive voltage detected by the first electrode pair 73 and the negative voltage detected by the second electrode pair 74 is larger. In the second refinement, the simulation result of the difference between the voltages generated from the first electrode pair 73 and from the second electrode pair 74 is seventeen times the difference between the voltages generated from the first electrode pair 11 and the second electrode pair 12 according to the first embodiment. Therefore, a pressing operation can more clearly be detected than the time when the pressing operation is received.

Figure 8A:
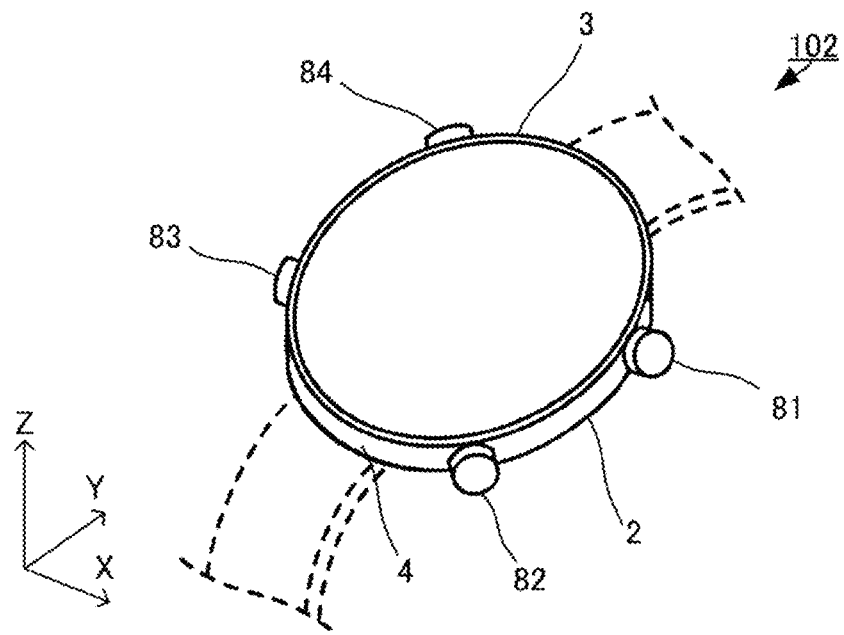
FIG. 8(A) is a perspective view of an electronic device using a pressure detection sensor according to a second embodiment.
Figure 8B:
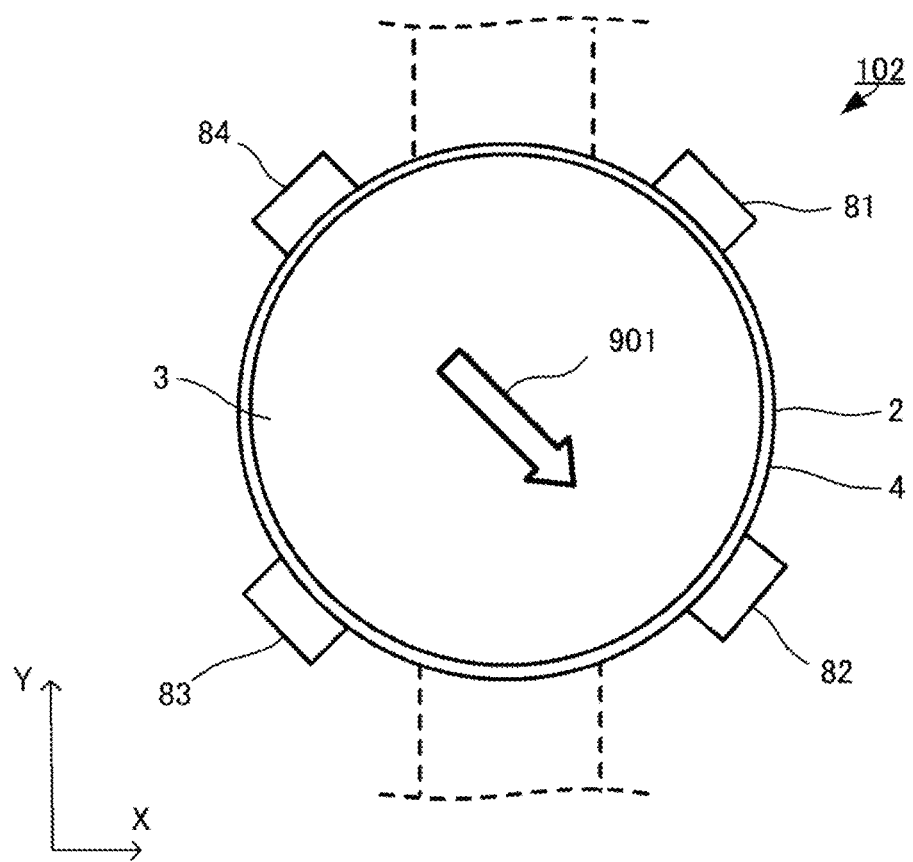
FIG. 8(B) is a plan view of the pressure detection sensor according to the second embodiment.
Figure 9:
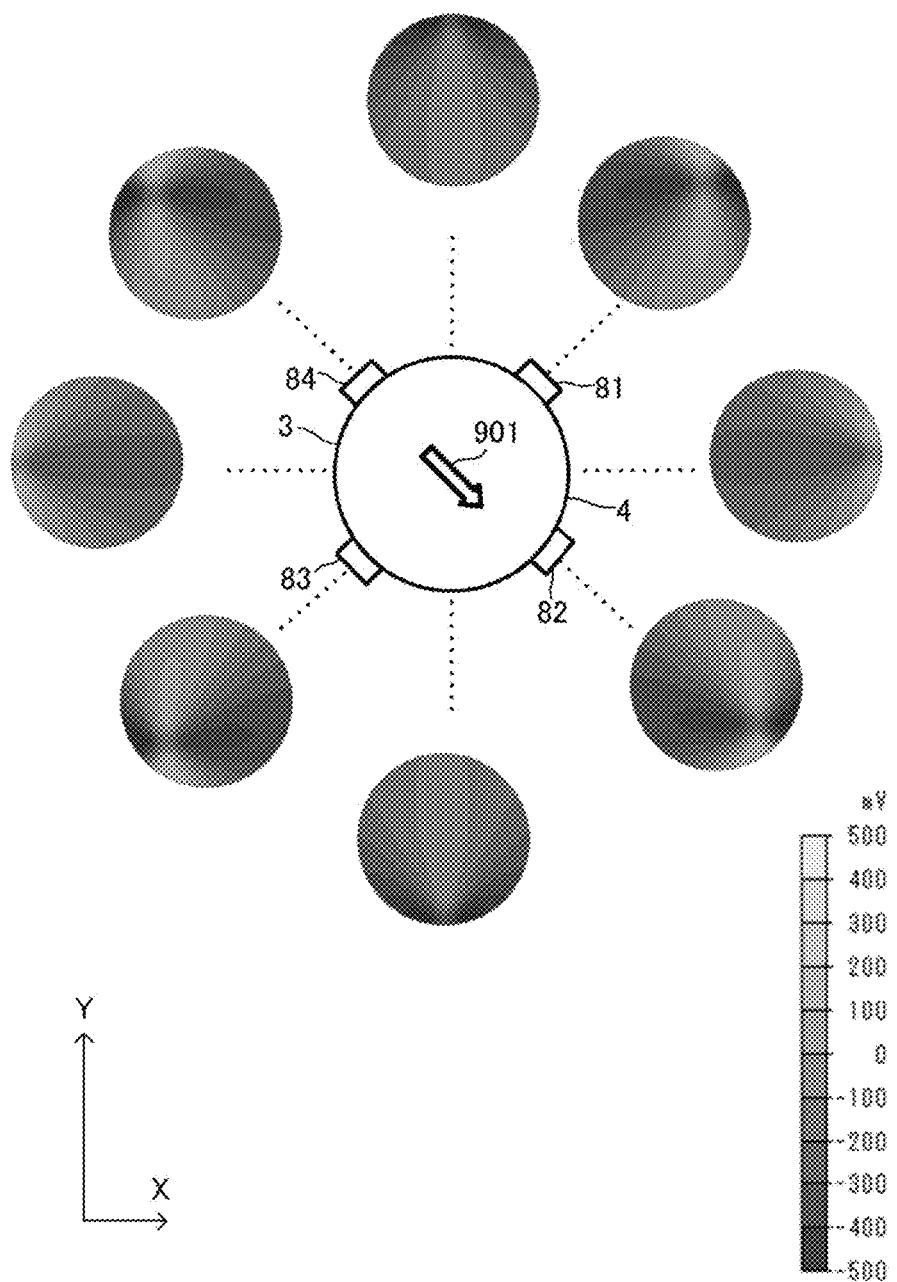
FIG. 9 is a diagram showing surface potential generated by a piezoelectric film according to the second embodiment.

FIG. 8(A) is a perspective view of an electronic device using a pressure detection sensor according to a second embodiment, and FIG. 8(B) is a plan view of the pressure detection sensor according to the second embodiment. FIG. 9 is a diagram showing surface potential generated by the piezoelectric film according to the second embodiment. FIG. 9 shows potential generated when a pressing operation is received with a force of 1 N from each direction around the piezoelectric film 15 formed in a circle having a diameter of 4 mm. In the second embodiment, the description on the same configuration as that of the first embodiment will be omitted, and only the different configuration will be described.

As shown in FIGS. 8(A) and 8(B), an electronic device 102 using the pressure detection sensor 10 according to the second embodiment includes a mechanical button 81, a mechanical button 82, a mechanical button 83, and a mechanical button 84. The mechanical button 81, the mechanical button 82, the mechanical button 83, and the mechanical button 84 are formed on the side surface part 4 of the electronic device 102. The mechanical button 81, the mechanical button 82, the mechanical button 83, and the mechanical button 84 each are disposed in a direction forming an angle parallel or perpendicular to the uniaxial stretching direction (arrow 901) of PLLA of the piezoelectric film 15.

As shown in FIG. 9, when the electronic device 102 receives a pressing operation in a direction (X-axis direction) of 45 degrees counterclockwise with respect to the uniaxial stretching direction (arrow 901) of the piezoelectric film 15, a negative voltage is generated. When the electronic device 102 receives a pressing operation from a direction (Y-axis direction) of 45 degrees clockwise with respect to the uniaxial stretching direction (arrow 901) of the piezoelectric film 15, a positive voltage is generated. On the other hand, when the electronic device 102 receives a pressing operation from a direction parallel or perpendicular to the uniaxial stretching direction (arrow 901) of the piezoelectric film 15, since positive and negative voltages generated from the piezoelectric film 15 are generated almost equally, the positive and negative voltages cancel each other and no voltage is generated.

As described above, when the electronic device 102 receives a pressing operation from a direction parallel or perpendicular to the uniaxial stretching direction (arrow 901) of the piezoelectric film 15, no voltage is generated from deformation of the piezoelectric film 15. Therefore, no voltage is generated from the piezoelectric film 15 when any of the mechanical button 81, the mechanical button 82, the mechanical button 83, and the mechanical button 84 arranged at this position are pressed. Therefore, since an extra voltage is not generated when each mechanical button is operated, it is possible to suppress occurrence of malfunction.

In addition, a mechanical button can also be arranged in a direction of 45 degrees counterclockwise or 45 degrees clockwise with respect to the uniaxial stretching direction (arrow 901) of the piezoelectric film 15. In this case, a button can be provided that is configured to generate a positive or negative voltage around the electronic device 102. The strength of the generated voltage is weaker compared with that generated when the front panel 3 receives a pressing operation. However, if the generated voltage has the same magnitude as that of the voltage generated when the front panel 3 receives a pressing operation, it is necessary to have a configuration to provide some differences.

In addition, in the pressure detection sensor 10, although the first region R1 and the second region R2 are formed to have the same area, they may have different areas. For example, when the first electrode pair 11 of the first region R1 is formed of a soft material compared with that of the second electrode pair 12 of the second region R2, the second region R2 which is less likely to deform may be formed to be larger. As described above, the areas of the first region R1 and the second region R2 can be changed depending on the specification.

According to the present invention, examples of the electronic device 100 include those to be worn such as a wristwatch and a headphone, and household appliances such as a vacuum cleaner and a washing machine. For example, even if vibration generated from a vacuum cleaner itself is transmitted to the pressure detection sensor 10, the pressure detection sensor 10 does not detect the vibration from the outside, and can detect only an output by a pressing operation. Further, in the case of a headphone, vibration from a speaker may be transmitted in addition to external vibration such as shaking of the body at the time of wearing or an unintentional touch by the operator. In this case, a threshold for the difference between the voltages detected by the first detection circuit 21 and the second detection circuit 22 may be set, and the control circuit 23 may determine that a pressing operation is performed only when there is a difference equal to or greater than the threshold.

Finally, the description of the exemplary embodiments is to be considered in all respects as illustrative and not restrictive. The scope of the present invention is indicated not by the embodiments described above but by the claims. Further, the scope of the present invention is intended to include all modifications within the scope and meaning equivalent to the claims.

DESCRIPTION OF REFERENCE SYMBOLS 10, 61, 71: Pressure detection sensor
11, 63: First electrode pair
12, 64: Second electrode pair
15: Piezoelectric film
65: Cutout portion
66, 114: Protrusion
100, 102: Electronic device
151: First main surface
152: Second main surface
R1: First region
R2: Second region

The invention claimed is:

1. A pressure detection sensor, comprising:
a piezoelectric film having a first region and a second region located outside the first region in a plan view thereof, with the piezoelectric film configured to be deformed in response to a pressing operation;
a first electrode pair respectively disposed on first and second main surfaces of the piezoelectric film that oppose each other and in the first region of the piezoelectric film;
a second electrode pair respectively disposed on the first and second main surfaces of the piezoelectric film and in the second region of the piezoelectric film;
a first detection circuit configured to detect a voltage output by the first electrode pair; and
a second detection circuit configured to detect a voltage output by the second electrode pair,
wherein one of the first and second detection circuits is configured to invert the respective voltage when the first electrode pair outputs a voltage having a same polarity as a polarity of a voltage output by the second electrode pair when the piezoelectric film receives the pressing operation.

2. The pressure detection sensor according to claim 1, wherein the first region has a surface area in the plan view of the piezoelectric film equal to a surface area of the second region in the plan view of the piezoelectric film.

3. The pressure detection sensor according to claim 1, wherein the piezoelectric film has a symmetrical shape in the plan view thereof.

4. The pressure detection sensor according to claim 3, wherein the piezoelectric film is circular in the plan view thereof.

5. The pressure detection sensor according to claim 1, wherein the piezoelectric film comprises a chiral polymer that is uniaxially stretched.

6. The pressure detection sensor according to claim 5, wherein the first electrode pair includes at least one cutout extending in a direction inclined by 45 degrees with respect to a stretching direction of the chiral polymer.

7. The pressure detection sensor according to claim 5, wherein the first electrode pair includes at least one protrusion that protrudes toward the second region in a direction inclined by −45 degrees with respect to a stretching direction of the chiral polymer.

8. The pressure detection sensor according to claim 1, wherein the first region is a center portion of the piezoelectric film in the plan view thereof, and second region surrounds at least a portion of the first region the plan view thereof.

9. The pressure detection sensor according to claim 1, wherein the respective electrodes of the first and second electrode pairs disposed on the second main surface of the piezoelectric film are configured as reference electrodes.

10. The pressure detection sensor according to claim 9, wherein the respective electrodes configured as reference electrodes are a single continuous electrode.

11. The pressure detection sensor according to claim 1, wherein the respective electrodes of the first and second electrode pairs disposed on the first main surface of the piezoelectric film are disposed in a same plane as each other and both extend to an outer side surface of the piezoelectric film.

12. A pressure detection sensor, comprising:
a piezoelectric film having first and second main surfaces that oppose each and being deformable in response to a pressing operation;
a first electrode pair disposed on the first and second main surfaces of the piezoelectric film, respectively, and in an inner region of the piezoelectric film relative to a planar view of one of the first and second main surfaces;
a second electrode pair disposed on the first and second main surfaces of the piezoelectric film, respectively, and in an outer region of the piezoelectric film relative to the planar view, with the outer region being outside the inner region in the planar view;
a first detection circuit configured to detect a voltage output by the first electrode pair; and
a second detection circuit configured to detect a voltage output by the second electrode pair,
wherein the first electrode pair is configured to output a voltage having a first polarity in response to the pressing operation of piezoelectric film, and
wherein the second detection circuit is configured to invert the detected voltage output by the second electrode pair when the voltage that is output therefrom has a second polarity in response to the pressing operation of piezoelectric film that is a same polarity as the first polarity.

13. The pressure detection sensor according to claim 12, wherein the first polarity is one of a positive and negative polarity and the second polarity is the other of the positive and negative polarity.

14. The pressure detection sensor according to claim 12, wherein the inner region has a surface area in the planar view that is equal to a surface area of the outer in the planar view.

15. The pressure detection sensor according to claim 12, wherein the piezoelectric film comprises a chiral polymer that is uniaxially stretched.

16. The pressure detection sensor according to claim 15, wherein the first electrode pair includes at least one cutout extending in a direction inclined by 45 degrees with respect to a stretching direction of the chiral polymer.

17. The pressure detection sensor according to claim 15, wherein the first electrode pair includes at least one protrusion that protrudes toward the second region in a direction inclined by −45 degrees with respect to a stretching direction of the chiral polymer.

18. The pressure detection sensor according to claim 12, wherein the respective electrodes of the first and second electrode pairs disposed on the second main surface of the piezoelectric film are configured as reference electrodes.

19. The pressure detection sensor according to claim 18, wherein the respective electrodes configured as reference electrodes are a single continuous electrode.

20. An electronic device comprising:
   a housing; and
   a pressure detection sensor that includes:
      a piezoelectric film having a first region and a second region located outside the first region in a plan view thereof, with the piezoelectric film configured to be deformed in response to a pressing operation;
      a first electrode pair respectively disposed on first and second main surfaces of the piezoelectric film that oppose each other and in the first region of the piezoelectric film;
      a second electrode pair respectively disposed on the first and second main surfaces of the piezoelectric film and in the second region of the piezoelectric film;
      a first detection circuit configured to detect a voltage output by the first electrode pair; and
      a second detection circuit configured to detect a voltage output by the second electrode pair,
      wherein one of the first and second detection circuits is configured to invert the respective voltage when the first electrode pair outputs a voltage having a same polarity as a polarity of a voltage output by the second electrode pair when the piezoelectric film receives the pressing operation.

\* \* \* \* \*